United States Patent
Cho

(10) Patent No.: US 7,629,824 B2
(45) Date of Patent: *Dec. 8, 2009

(54) DUTY CORRECTION CIRCUIT OF DIGITAL TYPE FOR OPTIMAL LAYOUT AREA AND CURRENT CONSUMPTION

(75) Inventor: Kwang Jun Cho, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/184,363

(22) Filed: Aug. 1, 2008

(65) Prior Publication Data

US 2008/0284478 A1    Nov. 20, 2008

Related U.S. Application Data

(63) Continuation of application No. 11/652,832, filed on Jan. 12, 2007, now Pat. No. 7,423,468.

(30) Foreign Application Priority Data

Jan. 12, 2006    (KR) .................. 10-2006-0003551

(51) Int. Cl.
*H03K 3/017* (2006.01)
(52) U.S. Cl. .................. 327/175; 327/172
(58) Field of Classification Search .................. None
See application file for complete search history.

(56) References Cited

U.S. PATENT DOCUMENTS

| | | | |
|---|---|---|---|
| 6,466,071 B2 * | 10/2002 | Kim et al. | 327/175 |
| 6,653,876 B2 | 11/2003 | Issa et al. | |
| 6,677,792 B2 * | 1/2004 | Kwak | 327/158 |
| 6,859,081 B2 * | 2/2005 | Hong et al. | 327/175 |
| 6,956,418 B2 * | 10/2005 | Kwak et al. | 327/158 |
| 7,212,055 B2 * | 5/2007 | Yoo et al. | 327/175 |
| 7,221,204 B2 * | 5/2007 | Kim et al. | 327/175 |

(Continued)

FOREIGN PATENT DOCUMENTS

KR    1020010094529 A    11/2001

(Continued)

*Primary Examiner*—Cassandra Cox
(74) *Attorney, Agent, or Firm*—Ladas & Parry LLP

(57) ABSTRACT

The present invention relates to a duty correction circuit that corrects a distorted duty of a clock signal using a delay unit and a delay controller, thereby reducing the layout area and current consumption. The duty correction circuit includes a repeater that generates a clock signal having the same phase as that of an input clock signal with a distorted duty, and a clock signal having an inverted phase of the phase; a delay line delaying the phase of the clock signal having the inverted phase and generating a feedback clock signal; a phase comparator comparing the phase of the clock signal having the same phase with the phase of the feedback clock signal and generating a delay control signal according to the phase difference between the phases of the clock signal having he same phase and the feedback clock signal; a delay controller controlling the amount of delay of the delay line according to the delay control signal; and a phase mixer performing half-phase blending on the clock signal having the same phase and the feedback clock signal and outputting a clock signal having a corrected duty.

7 Claims, 4 Drawing Sheets

U.S. PATENT DOCUMENTS

| | | | | |
|---|---|---|---|---|
| 7,268,601 B2 * | 9/2007 | Kwak | ...................... | 327/158 |
| 7,317,341 B2 * | 1/2008 | Cho | ...................... | 327/175 |
| 2005/0238128 A1 * | 10/2005 | Kim | ...................... | 375/376 |
| 2007/0103216 A1 * | 5/2007 | Han | ...................... | 327/175 |

FOREIGN PATENT DOCUMENTS

| | | |
|---|---|---|
| KR | 1020010095537 A | 11/2001 |
| KR | 1020030002436 A | 1/2003 |
| KR | 1020050103698 A | 11/2005 |

* cited by examiner

DUTY CORRECTION CIRCUIT OF DIGITAL TYPE FOR OPTIMAL LAYOUT AREA AND CURRENT CONSUMPTION

CROSS-REFERENCE TO RELATED APPLICATIONS

The present application claims priority to Korean patent application number 10-2006-0003551 filed on Jan. 12, 2006, which is incorporated herein by reference in its entirety.

BACKGROUND OF THE INVENTION

The present invention relates to a duty correction circuit, and more particularly, to a duty correction circuit that is implemented as a digital-type duty correction circuit and is capable of reducing the layout area and current consumption.

In general, a duty correction circuit (DCC) detects duty errors of an external clock signal and corrects the external clock signal such that the duty rate of an internal clock signal of a semiconductor device such as a DRAM is maintained at 50%.

A semiconductor device such as a DDR SDRAM receives and transmits data in synchronization with the rising edges and the falling edges of an external clock signal. Therefore, data outputted from or inputted to such a semiconductor device must be aligned exactly with the rising or falling edges of the external clock signal.

The DDR SDRAM controls the output of data using a Delay Locked Loop (DLL) circuit or a Phase Lock Loop (PLL) circuit, both of which generate internal clock signals, in order to synchronize the data with the external clock signal.

When the duty rate (the ratio between a low pulse width and a high pulse width) of an external clock signal is distorted or when the duty rate of the data output control clock signal in a semiconductor device is distorted, the valid data window decreases in size and becomes problematic. Considering that signal integrity is optimal when the clock duty rate of a data output is 1:1, a duty correction circuit is necessary to correct any distorted duty rate.

Duty correction circuits are classified into analog duty correction circuits and digital duty correction circuits, as well as closed loop duty correction circuits and open loop duty correction circuits. A high percentage of analog duty correction circuits are classified as closed loop duty correction circuits.

Analog duty correction circuits are considered to be of high precision and are insensitive to changes in the Process Voltage Temperature (PVT). However, analog duty correction circuits are not suitable for high-speed operations because too much time is consumed in obtaining a clock signal with a duty rate of 50% since duty errors are detected by using capacitors.

Accordingly, in order to resolve this problem characteristic of analog duty correction circuits, a conventional phase mixer type digital duty correction circuit, as illustrated in FIG. 1, can be used. The conventional phase mixer type digital duty correction circuit allows high-speed operation but requires two DLLs (a first DLL and a second DLL) to align the external clock signal CLK and the inverted external clock signal CLKB, both of which are from an external clock signal, with the rising edges and to generate a rising clock signal CLK1 and a falling clock signal CLK2. For this reason requiring use of two DLLs, the conventional phase mixer type digital duty correction circuit requires a wide layout area and consumes a high level of current.

Also, the conventional phase mixer type digital duty correction circuit as shown in FIG. 1 forms two delay loops (a first delay loop and a second delay loop) through which the output of the phase mixer is fed back. The conventional duty correction circuit therefore depends on the DLLs (for example, the first and second DLLs), which is not desirable.

SUMMARY OF THE INVENTION

The present invention provides, inter alia, a digital-type duty correction circuit that is capable of minimizing the layout area and current consumption while maintaining excellent high-speed operation characteristics.

The present invention also provides, inter alia, a duty correction circuit that is independent from DLLs and corrects the distorted duty of a clock signal.

The present invention provides a duty correction circuit including: a repeater generating a clock signal having the same phase as that of an input clock signal with a distorted duty, and a clock signal having the inverted phase of the phase; a delay line delaying the phase of the clock signal having the inverted phase and generating a feedback clock signal; a phase comparator comparing the phase of the clock signal having the same phase with a phase of the feedback clock signal, and generating a delay control signal according to a phase difference between the phases of the clock signal having the same phase and the feedback clock signal; a delay controller controlling the delay of the delay line according to the delay control signal; and a phase mixer performing half-phase blending on the clock signal having the same phase and the feedback clock signal and outputting a clock signal having a corrected duty.

Preferably, the repeater includes at least one inverter.

Also, the delay line has a structure in which a plurality of unit delay cells are successively connected in series to each other, and each unit delay cell includes a NAND gate and an inverter, or alternatively two NAND gates.

Preferably, the phase comparator is a D flipflop having a clock terminal, to which the clock signal having the same phase is applied, and a data terminal, to which the feedback clock signal is applied.

Also, the phase comparator includes a first comparator comparing the phase of the clock signal having the same phase with the phase of the feedback clock signal, without any unit delay, and a second comparator comparing the phase of the clock signal having the same phase with a phase of a feedback clock signal, which is obtained by delaying the feedback clock signal by one unit.

Also, the delay controller includes one shift register and one counter.

Also, the phase mixer includes a first inverter that receives the clock signal having the same phase, a second inverter that receives the feedback clock signal, and a third inverter that receives the outputs of the first inverter and the second inverter.

Also, the phase mixer has a structure in which a plurality of tri-state inverters are connected in parallel to each other, with respect to each of the clock signals having the same phase and the feedback clock signal.

Also, in the half-phase blending, when the rising edge of the clock signal having the same phase is aligned with the rising edge of the feedback clock signal by the delay line, the rising edge of an output clock signal of the phase mixer is generated at the rising edge of the clock signal having the same phase, and the falling edge of the output clock signal of the phase mixer is generated with the intermediate phase of falling edges of the clock signal having the same phase and the feedback clock signal.

Also, the repeater can delay the clock signal having the same phase.

DESCRIPTION OF SPECIFIC EMBODIMENTS

Hereinafter, embodiments of the present invention will be described in detail with reference to the appended drawings.

Figure 1:
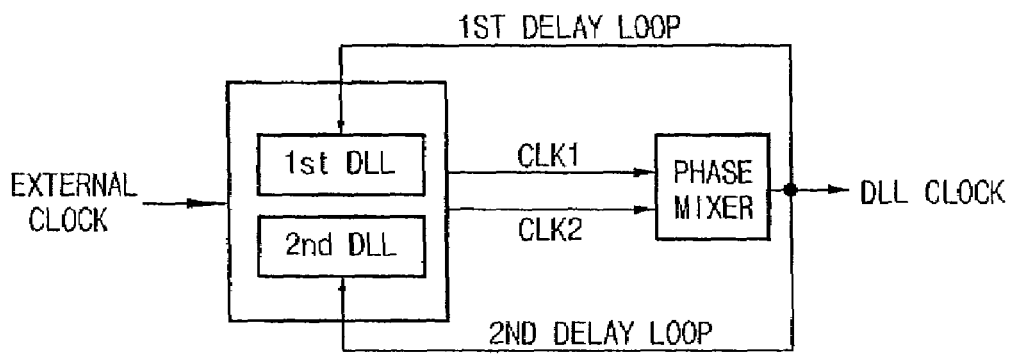
FIG. 1 is a block diagram showing a conventional phase mixer type digital duty correction circuit requiring use of two digital locked loops (DLLs).
Figure 2:
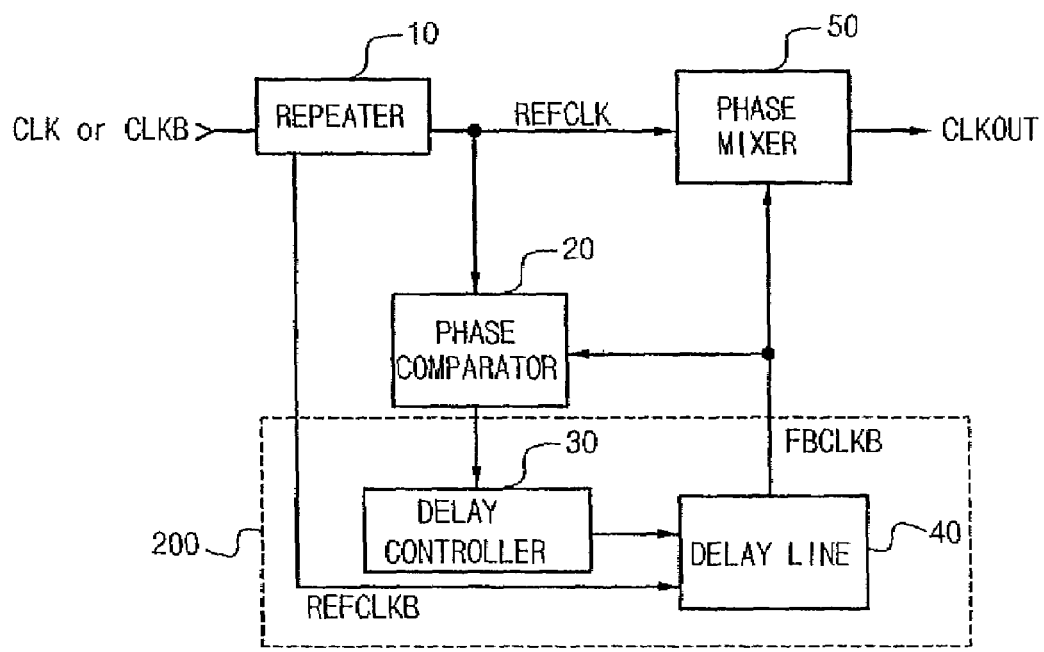
FIG. 2 is a block diagram showing a duty correction circuit according to an embodiment of the present invention.

FIG. 2 is a block diagram of a duty correction circuit (DCC) according to an embodiment of the present invention. As illustrated in FIG. 2, the duty correction circuit includes a repeater 10, a phase comparator 20, a delay controller 30, a delay line 40, and a phase mixer 50. Here, the delay controller 30 and the delay line 40 are a part of a delay circuit 200.

The repeater 10 outputs a reference clock signal REFCLK having the same phase as the input clock signal CLK or CLKB to the phase comparator 20 and the phase mixer 50. The repeater 10 also generates an inverted reference clock signal REFCLKB with a phase inverted by 180° from the phase of the input clock signal CLK or CLKB. The repeater 10 outputs the inverted reference clock signal REFCLKB to the delay line 40.

The repeater 10 may be formed by utilizing one or more inverters. Further, the repeater 10 can delay the reference clock signal REFCLK having the same phase as the input clock signal CLK or CLKB and output the delayed reference clock signal REFCLK to the phase comparator 20 and the phase mixer 50.

The phase comparator 20 compares the phase of the reference clock signal REFCLK received from the repeater 10 with the phase of the feedback clock signal FBCLKB received from the delay line 40, and generates a comparison result signal corresponding to the phase difference of the two clock signals REFCLK and FBCLKB to the delay controller 30. The feedback clock signal FBCLKB is a clock signal obtained by inverting the input clock signal CLK or CLKB and controlling the delay of the input clock signal CLK or CLKB.

Figure 3:
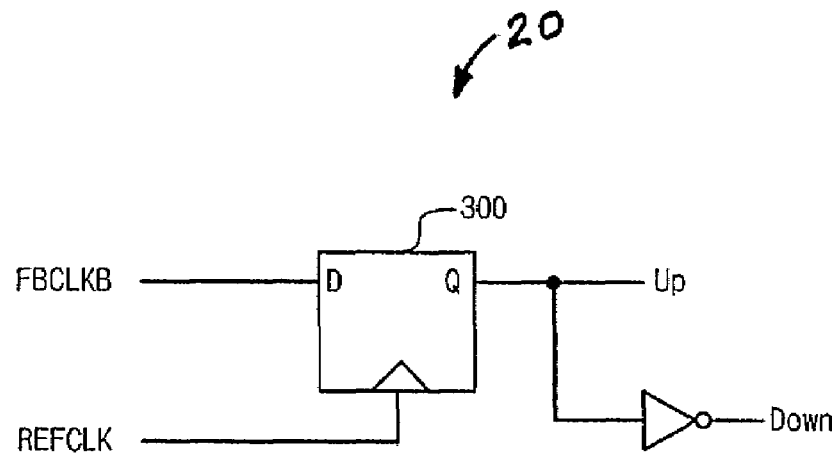
FIG. 3 shows a circuit for a phase comparator utilizing a flip flop according to an embodiment of the present invention.

The phase comparator 20 may utilize a flipflop, such as a D flipflop 300 as shown in FIG. 3 having a clock terminal to which the reference clock signal REFCLK is inputted and a data terminal to which the feedback clock signal FBCLKB is inputted. Here, the comparison result signal corresponding to the phase difference of the two clock signals REFCLK and FBCLKB can be defined as an "up" or "down" signal as shown in FIG. 3.

Figure 4:
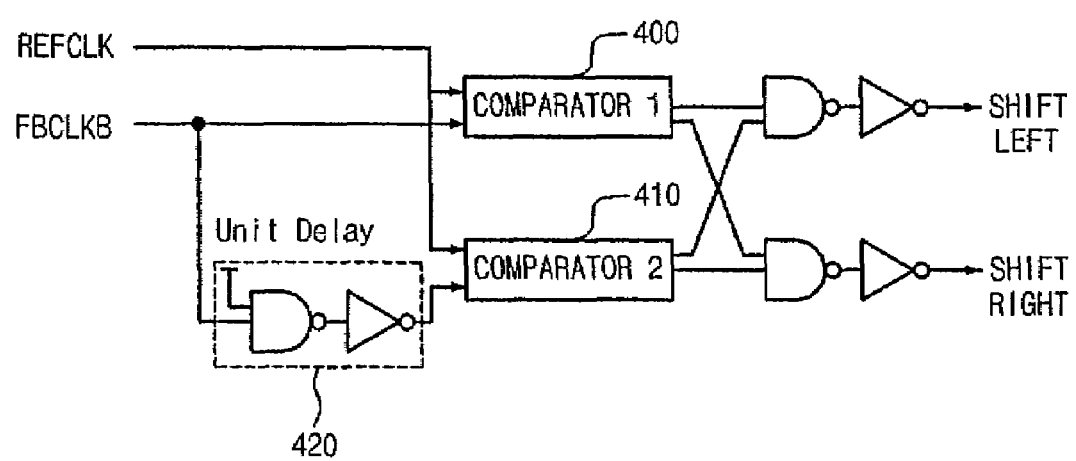
FIG. 4 shows a circuit for a phase comparator utilizing phase comparators according to an embodiment of the present invention.

Also, the phase comparator 20, as shown in FIG. 4, can include a first comparator 400 comparing the phase of the reference clock signal REFCLK with the phase of the feedback clock signal FBCLKB, and a second comparator 410 comparing the phase of the feedback clock signal FBCLKB, delayed one unit by a unit delay 420, with the phase of the reference clock signal REFCLK. Here, the unit delay 420 corresponds to the unit delay of the delay line 40 (FIG. 2), which is controlled by the delay controller 30 (FIG. 2). Accordingly as shown in FIG. 4, the comparison result signal corresponding to the phase difference of the two clock signals REFCLK and FBCLKB can be defined as a "shift left" signal or a "shift right" signal.

The delay controller 30 controls the delay of the delay line 40 according to the comparison result signal of the phase comparator 20. The delay controller 30 may be or may include at least a shift register or a counter.

The delay line 40 receives the inverted reference clock signal REFCLKB, delays the phase of the inverted reference clock signal REFCLKB according to the control signal of the delay controller 30, and generates the feedback clock signal FBCLKB. Accordingly, the rising edge of the feedback clock signal FBCLKB is aligned with the rising edge of the reference clock signal REFCLK.

The delay line 40 can have a structure in which a plurality of unit delay cells are successively connected in series to each other. Here, preferably, each unit delay cell includes a NAND gate and an inverter, or, alternatively, two NAND gates.

Figure 5:
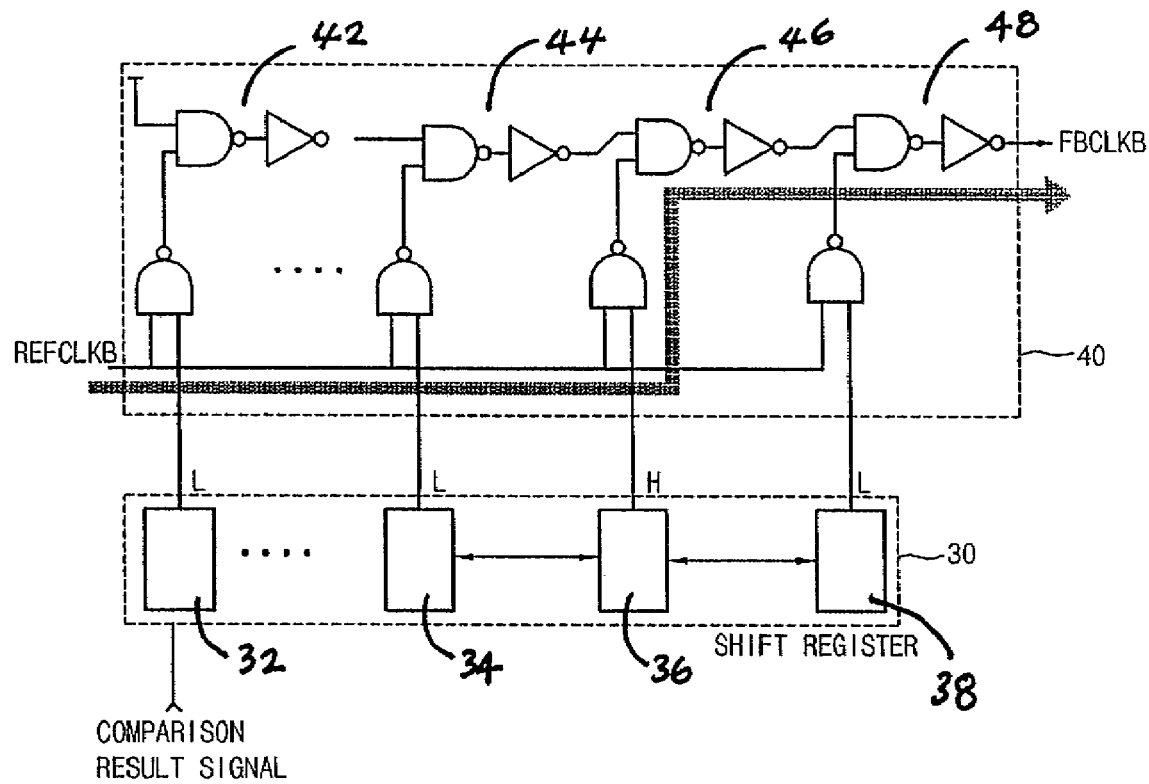
FIG. 5 shows a delay unit according to an embodiment of the present invention.

FIG. 5 shows a delay line 40 having at least one unit delay cell 42, 44, 46, 48 that includes a NAND gate and an inverter where the delay unit 40 is controlled by the delay controller 30, which includes at least a shifter register 32, 34, 36, 38. As illustrated in FIG. 5, a plurality of unit delay cells 42, 44, 46, 48 are successively connected in series to each other in the delay line 40, wherein each unit delay cell 42, 44, 46, 48 includes a NAND gate and an inverter, and each shift register 52, 54, 56, 58 is serially connected to each other and in parallel to each corresponding one of the unit delay cells 42, 44, 46, 48.

In the delay line 40, when an inverted reference clock signal REFCLKB is applied to any one of the unit delay cells 42, 44, 46, 48 according to the output signal of the shift register in the delay controller 30, the phase of the inverted reference clock signal REFCLKB is delayed and outputted from the unit delay cell 42, 44, 46, 48 and through the series of unit delay cells 42, 44, 46, 48.

In order to increase the phase delay, the delay controller 30 generates a shift-left signal through the shift register. In order to decrease the phase delay, the delay controller 30 generates a shift-right signal through the shift register.

The phase mixer 50 performs half-phase blending on the reference clock signal REFCLK and the feedback clock signal FBCLKB, which is delayed and inverted by the delay line 40. Here, the half-phase blending refers to utilizing the fact that a duty-distorted clock signal has a "low" or "high" pulse width by an insufficient value in a "high" or "low" pulse width due to the duty-distortion.

More specifically, after the rising edge of the reference clock signal REFCLK is aligned with the rising edge of the feedback clock signal FBCLKB, the rising edge of the output clock signal is generated at the rising edge of the reference clock signal REFCLK, and the falling edge of the output clock signal is generated with an intermediate phase of falling edges of the reference clock signal REFCLK and the feedback clock signal FBCLKB. Accordingly, the distorted duty of the input pulse signal can be corrected to 50%.

Figure 6:
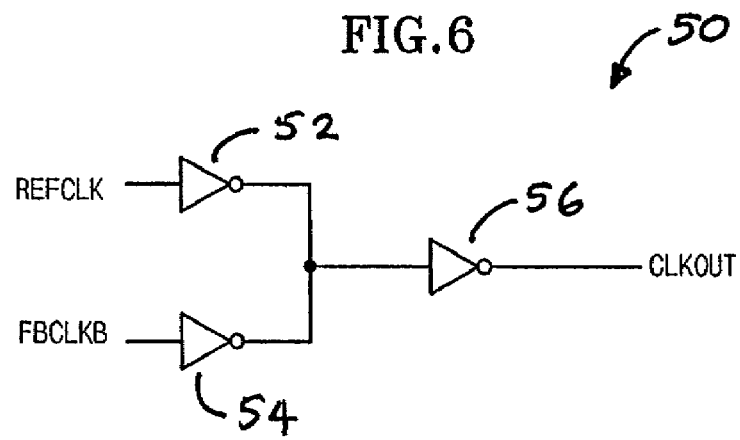
FIG. 6 shows a phase mixer according to an embodiment of the present invention.

The phase mixer 50, as illustrated in FIG. 6, includes a first inverter 52 that receives the reference clock signal REFCLK, a second inverter 54 that receives the feedback clock signal FBCLKB, and a third inverter 56 that receives the outputs of the first and second inverters.

When setting the duty of the output clock signal CLKOUT of the phase mixer 50 to exactly 50% as possible, if the phase of the reference clock signal REFCLK precedes the phase of the feedback clock signal FBCLKB, it is preferable to increase the size of the first inverter 52 rather than the second inverter 54. If the phase of the reference clock signal REFCLK lags behind the phase of the feedback clock signal FBCLKB, it is preferable to increase the size of the second inverter 54 rather than the first inverter 52. However, since input clock signals can be generated in both cases, it is optimal for the size of the first inverter 52 to equal the size of the second inverter 54.

Figure 7:
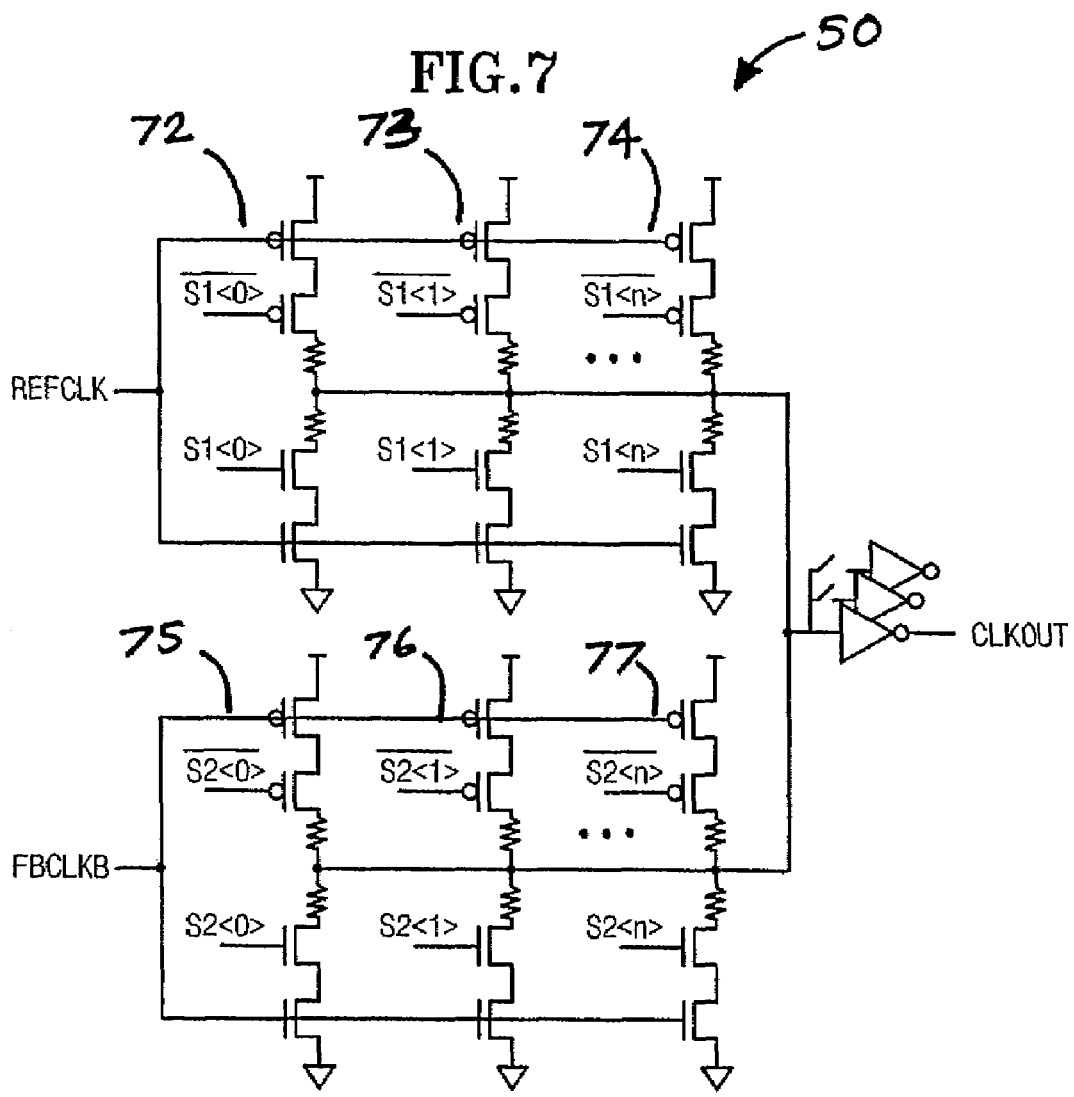
FIG. 7 shows a phase mixer having a structure in which a plurality of tri-state inverted are connected in parallel to each other according to an embodiment of the present invention.

Also, as illustrated in FIG. 7, the phase mixer 50 can have a structure in which a plurality of tri-state inverters 72, 73, 74 and 75, 76, 77 are connected in parallel to each other, with respect to both the reference clock signal REFCLK and the feedback clock signal FBCLKB. Here, the tri-state inverter 72, 73, 74, 75, 76, 77, 78 is a circuit that functions as an inverter according to a control signal ($\overline{S1}$<0:n>, S1<0:n>, $\overline{S2}$<0:n>, S2<0:n>) or whose output clock signal CLKOUT can be at a high impedance state.

If all tri-state inverters 72, 73, 74 connected to the reference clock signal (REFCLK) side function as inverters, all tri-state inverters 75, 76, 77 connected to the feedback clock signal (FBCLKB) side enter a high impedance state. At this time, the reference clock signal REFCLK is bypassed as the phase mixer 50 will output a signal.

If the case where the reference clock signal REFCLK is bypassed is defined as having a weight of "0", increasing the weight means that, while the number of tri-state inverters 72, 73, 74 functioning as inverters connected to the reference clock signal (REFCLK) side are reduced, tri-state inverters 75, 76, 77 (corresponding to the reduced number of the tri-state inverters 72, 73, 74) function as inverters on the feedback clock signal (FBCLKB) side.

Accordingly, it is possible to generate an output signal CLKOUT with the exact intermediate phase of the phases of the reference clock signal REFCLK and the feedback clock signal FBCLKB.

Since the duty correction circuit according to an embodiment of the present invention has a structure in which a distorted duty is corrected using a delay line and a delay controller, neither additional DLL nor additional delay loop (for example, a second DLL and a second delay loop of conventional techniques) are needed.

Generally, considering that a delay line occupies the largest area in a DLL, the duty correction circuit according to an embodiment of the present invention occupies a smaller layout area and has lower current consumption than conventional duty correction circuits.

Also, a conventional duty correction circuit has a dual loop structure which includes a first DLL loop, aligning the rising edge of the DLL clock signal with the rising edge of a clock signal, and a second delay loop, aligning the falling edge of the DLL clock signal with the rising edge of the clock signal, wherein a duty is corrected using the output signal of the dual loop structure. That is, the conventional duty correction circuit has a DLL-dependent structure.

Meanwhile, the duty correction circuit according to the present embodiment has an independent loop structure without a DLL loop (the second DLL loop of the conventional technique) aligning the falling edge of the DLL clock signal with the rising edge of a clock signal. That is, since the duty correction circuit according to an embodiment of the present invention can be configured regardless of DLLS, the duty correction circuit can be arbitrarily located before data is outputted according to the data output control clock signal from an external clock buffer. However, it is optimal for the duty correction circuit according to an embodiment of the present invention to be located ahead of the data output control clock driver.

Figure 8:
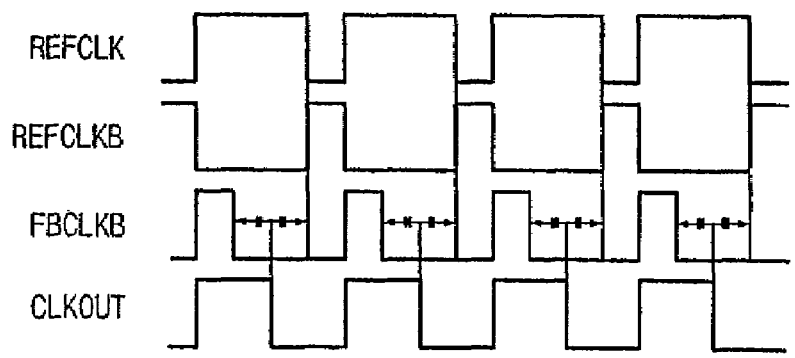
FIG. 8 is a timing diagram associated with operation of a duty correction circuit according to an embodiment of the present invention.

FIG. 8 is a timing diagram for explaining the operation of the duty correction circuit as shown in FIG. 2. Referring to FIGS. 2 and 8, the repeater 10 generates a reference clock signal REFCLK, which has the same phase as an input clock signal, and transfers the reference clock signal REFCLK to the phase comparator 20 and the phase mixer 50. Also, the repeater 10 generates an inverted reference clock signal REFCLKB with a phase inverted by 180° from the input clock signal and transfers the reference clock signal REFCLKB to the delay line 40.

The phase comparator 20 compares the phase of the reference clock signal REFCLK with the phase of the feedback clock signal FBCLKB, and transfers the control signal according to the phase difference between the phases of the both clock signals REFCLK and FBCLKB to the delay controller 30. The delay controller 30 controls the delay of the delay line 40 and the rising edge of the feedback clock signal FBCLKB is aligned with the rising edge of the reference clock signal REFCLK according to the control signal from the delay controller 30.

The phase mixer 50 receives the reference clock signal REFCLK and the feedback clock signal FBCLKB and performs half-phase blending on the reference clock signal REFCLK and the feedback clock signal FBCLKB, thereby correcting the distorted duty and generating an output signal CLKOUT with a duty of 50%.

As described above, since a duty correction circuit according to an embodiment of the present invention has a structure in which a distorted duty of a clock signal is corrected using a delay line (such as FIG. 2, 40) and a delay controller (such as FIG. 2, 30), it is possible to reduce the layout area and current consumption as compared to conventional techniques.

Also, since the duty correction circuit according to an embodiment of the present invention can be configured independently from DLLs in contrast to conventional duty correction circuits, the duty correction circuit can be arbitrarily located before data is outputted according to the data output control clock signal from an external clock buffer.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A duty correction circuit comprising:
   a repeater generating a first clock signal and a second clock signal, wherein the second clock signal has an inverted phase of the first clock signal;
   a delay line delaying the phase of the second clock signal to generate a feedback clock signal;
   a delay controller controlling to delay the phase of the second clock signal of the delay line according to the phase difference between the phase of the first clock signal and the feedback clock signal; and a phase mixer outputting a clock signal generated by performing a half-phase blending on the first clock signal and the feedback clock signal.

2. The duty correction circuit of claim 1, wherein the repeater comprises at least one inverter.

3. The duty correction circuit of claim 1, wherein the delay line has a structure in which a plurality of unit delay cells are successively connected in series to each other and each unit delay cell comprises a NAND gate and an inverter.

4. The duty correction circuit of claim 1, wherein the delay line has a structure in which a plurality of unit delay cells are successively connected in series to each other and each unit delay cell comprises two NAND gates.

5. The duty correction circuit of claim 1, wherein the phase mixer comprises a first inverter receiving the first clock signal, a second inverter receiving the feedback clock signal, and a third inverter receiving output signals of the first and second inverters.

6. The duty correction circuit of claim 1, wherein the phase mixer has a structure in which a plurality of serially connected tri-state inverters are connected in parallel to each other, with respect to each of the first clock signal and the feedback clock signal.

7. The duty correction circuit of claim 1, wherein, in the half-phase blending, in the state that a rising edge of the first clock signal is aligned with a rising edge of the feedback clock signal by the delay line, a rising edge of an output clock signal of the phase mixer is generated at the rising edge of the clock signal having the same phase, and a falling edge of the output clock signal of the phase mixer is generated with an intermediate phase of falling edges of the first clock signal and the feedback clock signal.

* * * * *